US 6,711,545 B1

(12) United States Patent
Hörndl

(10) Patent No.: US 6,711,545 B1
(45) Date of Patent: Mar. 23, 2004

(54) HAND-HELD TRANSMITTER HAVING SPEECH STORAGE ACTUATED BY TRANSMISSION FAILURE

(75) Inventor: Manfred Hörndl, Horn (AT)

(73) Assignee: Koninklijke Philips Electronics N.V., Eindhoven (NL)

( * ) Notice: Subject to any disclaimer, the term of this patent is extended or adjusted under 35 U.S.C. 154(b) by 329 days.

(21) Appl. No.: 09/686,156

(22) Filed: Oct. 11, 2000

(30) Foreign Application Priority Data

Oct. 13, 1999 (EP) ............................................. 99890323

(51) Int. Cl.⁷ ......................... G10L 21/02; G10L 15/20; G10L 15/04
(52) U.S. Cl. ........................ 704/275; 704/233; 704/252
(58) Field of Search ......................... 704/200, 500–502, 704/201, 7, 3; 455/457, 404, 411, 463, 413; 370/345; 342/37; 463/7

(56) References Cited

U.S. PATENT DOCUMENTS

| | | | | |
|---|---|---|---|---|
| 5,479,479 A | * | 12/1995 | Braitberg et al. | 455/404 |
| 5,510,924 A | * | 4/1996 | Terui et al. | 455/413 |
| 5,592,489 A | * | 1/1997 | Tanaka | 370/345 |
| 5,651,051 A | * | 7/1997 | Stuart | 455/463 |
| 5,785,592 A | * | 7/1998 | Jacobsen | 463/7 |
| 5,798,726 A | * | 8/1998 | Schuchman et al. | 342/37 |
| 5,818,800 A | | 10/1998 | Barker | 369/25 |
| 5,887,251 A | * | 3/1999 | Fehnel | 455/411 |
| 5,963,867 A | * | 10/1999 | Reynolds et al. | 455/457 |
| 6,173,250 B1 | * | 1/2001 | Jong | 704/3 |

FOREIGN PATENT DOCUMENTS

| | | | | |
|---|---|---|---|---|
| DE | 0 538 794 A1 | * | 4/1993 | G06F/3/16 |
| EP | 0633520 A1 | | 1/1995 | |
| JP | 06-202803 | * | 7/1994 | G06F/3/33 |

* cited by examiner

Primary Examiner—Daniel Nolan

(57) ABSTRACT

A device for processing speech signal is disclosed comprising a speech signal input and speech signal digitizer, a control signal input and control signal digitizer, a digital signal processor, a transmitter to transmit processed digital signals in a cordless fashion to a base station, and a storage means, which is connected upstream of the transmitter and by which, depending on the quality of the communication link between the device and the base station, buffers the processed digital signals to be supplied and to be transmitted between the device and the base station.

7 Claims, 2 Drawing Sheets

HAND-HELD TRANSMITTER HAVING SPEECH STORAGE ACTUATED BY TRANSMISSION FAILURE

BACKGROUND OF THE INVENTION

The invention relates to a device for processing a speech signal.

Such a device is known from patent document EP 0 633 520 A1, FIG. 3. In this device is provided a microphone as a speech signal input means and keys and input-wheels, and a touch-sensitive input tablet as control signal input means for inputting control signals. The known device is provided and arranged for co-operation with a base station, the base station in essence comprising a personal computer, a monitor and a keyboard while, in addition, also a so-called mouse can be provided. With the known device there is the problem that there must always be a communication link corresponding, in essence, to a line-of-sight link between the device and the base station to always have an interference-free cordless communication between the transmitter means of the device and the receiving means of the base station and to always ensure that speech signals input by the speech signal input means, thus the microphone of the device, can be transmitted to the base station. As soon as the interference-free communication link is interrupted in the known device, this will result in an interruption of the transmission of the speech signals input by the speech signal input means. This again leads to the fact that the speech signals input by the speech signal input means while the interruption of the interference-free communication link is taking place are not processed in the base station and not recorded either, although desired, if necessary.

SUMMARY OF THE INVENTION

It is an object of the invention to avoid in a simple manner the problems stated above and provide an improved device.

To achieve this object, such a device includes a speech signal input and speech signal digitizer, a control signal input and control signal digitizer, a digital signal processor, a transmitter to transmit processed digital signals in a cordless fashion to a base station, and a storage device, which is connected upstream of the transmitter and by which, depending on the quality of the communication link between the device and the base station, buffer the processed digital signals to be supplied and to be transmitted between the device and the base station.

In this manner there is achieved that with a device according to the invention speech signals input by the speech signal input means and digitized thereafter can always be buffered by the storage means and, after being buffered, be transmitted to a base station provided for co-operation with the device according to the invention. As long as a perfect communication link between the device according to the invention and a base station provided for cooperation with this device, speech signals which are input and digitized are buffered in the storage means and practically immediately thereafter, thus simultaneously, again read from the storage means and transmitted to the base station. Before a user of the device according to the invention leaves the room or area with the device in operation held in hand, which room or area is available for a perfect communication, the user can, for example, by manually actuating a key provided on the device according to the invention, interrupt the reading of buffered digital speech signals from the storage means and the subsequent transmission of these buffered digital speech signals to the base station, after which digital speech signals which are input are then buffered for a rather long bridging period, without these speech signals during this bridging period being read out from the storage means used as a buffer and transmitted to the base station. When, subsequently, the user again enters the room or area necessary for a perfect communication while he has the device in his hand during operation, the user can, for example, by keying-in a key, reactivate the reading of the digital speech signals buffered in the storage means during the said bridging period, so that then, after this bridging period, the buffered digital speech signals that have been read out are transferred to the transmitter means of the device and these digital speech signals are further flawlessly transmitted to the base station provided for this purpose.

In a device according to the invention it has proved to be advantageous when, additionally, the storage device is additionally provided for storing and reading digital control signals (DCS) to be transmitted, because in this manner not only digital speech signals, but also digital control signals can be buffered.

According to another aspect of the invention, a device according to the invention it has proved to be particularly advantageous when in lieu of the possibility of manually interrupting and starting the transmission of buffered digital speech signals from the device according to the invention to a base station provided for this purpose and automatic buffering is provided. They provide in a simple manner an automatic interruption and an automatic starting of the reading of buffered digital speech signals and, therefore, of the transmission of buffered digital speech signals from a device according to the invention to a base station provided for this purpose.

According to another aspect of the invention, a device according to the invention has been further proved to be highly advantageous when, additionally, the detection means includes an identification signal generator for generating an identification signal and the identification signal can be applied to the transmitter means and transmitted by the transmitter means to the receiving means of a base station is provided, because in this manner it is possible to reach a high accuracy of detection.

The aspects stated above and further aspects of the invention will be apparent from the examples of embodiment described hereinafter and explained with reference to these examples of embodiment.

The invention will be explained in the following with reference to two examples of embodiments shown in the drawings, to which, however, the invention is not restricted.

DESCRIPTION OF THE PREFERRED EMBODIMENTS

Figure 1:
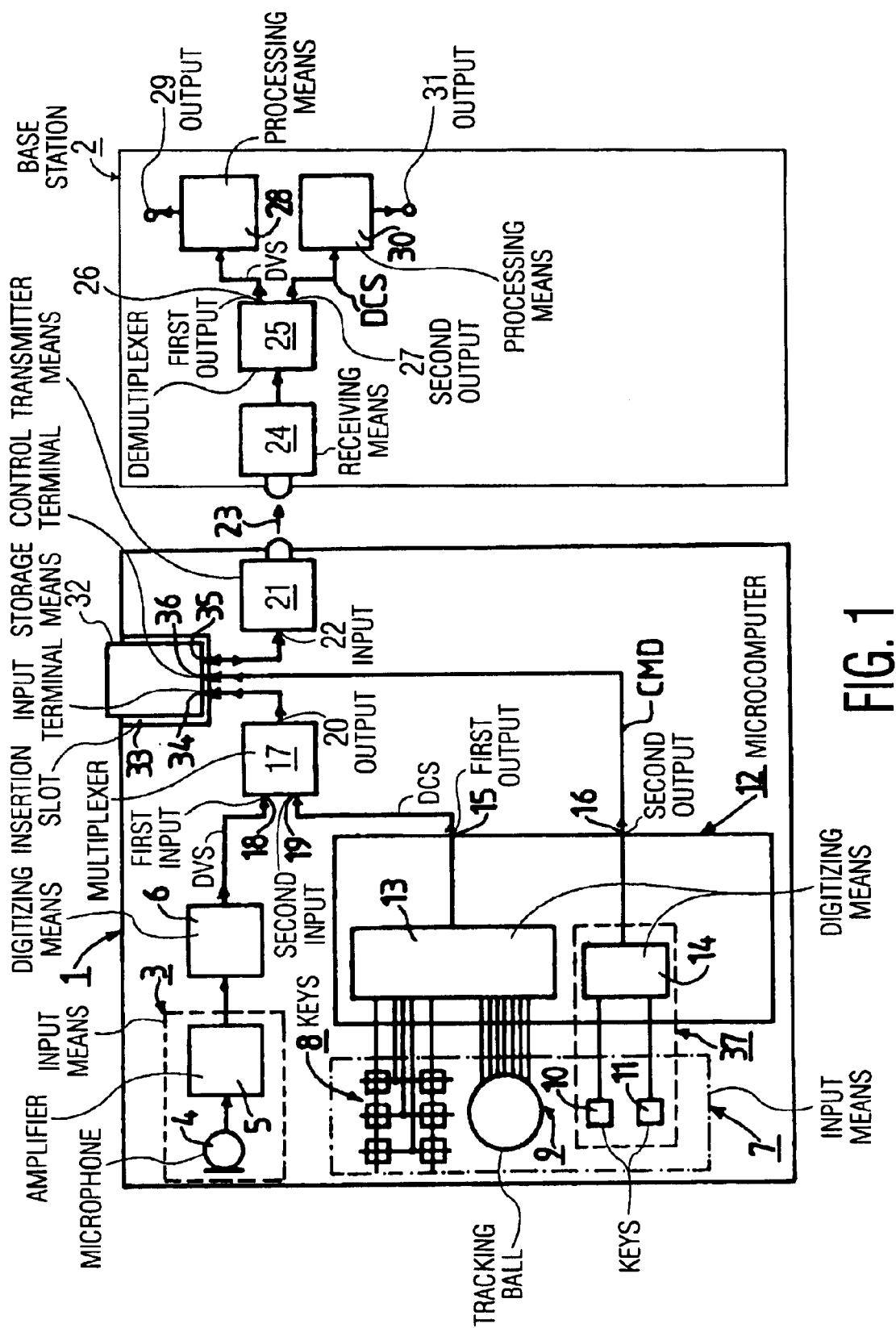
FIG. 1 shows in a schematic manner and in the form of a block diagram a device according to the invention corresponding to a first example of embodiment of the invention.

FIG. 1 shows a device 1 according to a first example of embodiment of the invention and this device 1 is a so-called dictation microphone. FIG. 1 further shows a base station 2 provided for co-operation with the device 1, which base station 2 is, in essence, a personal computer which co-operates with a monitor (not shown) and a keyboard (not shown) and a mouse (not shown). By means of the base station 2 can be received and stored on the hard drive of the base station 2 dictations, thus dictated speech signals, which are received by the device 1 and processed and converted into digital speech signals, which possibility of receiving the speech signals and storing them on the hard drive of the base station 2 will not be further discussed in this connection, because in the present context this is not essential and, furthermore, has been known for a long time from existing digital dictation systems.

The device 1, that is, the dictation microphone, can be held in hand during operation as this has also been known for a long time. The device 1 includes speech signal input means 3 which in the present case comprise a microphone 4 and an amplifier 5. By means of the microphone 4, uttered speech can be changed into analog speech signals which can be amplified by the amplifier 5.

To the amplifier 5 of the speech signal input means 3 are connected speech signal digitizing means 6 for digitizing the analog speech signals that are input. The speech signal digitizing means 6 are arranged in a simple manner as an A/D converter and produce digital speech signals DVS.

The device 1 further includes control signal input means 7 provided for inputting control signals. The control signal input means 7 include a set of keys 8, which in the present case comprises six keys. By means of the keys of the key set 8 control instructions can be keyed-in and analog control signals can be generated by which various dictation modes can be activated or deactivated respectively, for example, "record", "play", "fast forward", "fast rewind", "stop" and "mark". Furthermore, the control signal input means 7 contain a so-called tracking ball 9 by which control signals can be generated to move a cursor on the picture screen of a monitor that co-operates with the base station 2. The control signal input means 7 further have two keys 10 and 11, the first key 10 of which is used to stop reading from the memory and the second key 11 of which is used to start reading from the memory, which will be further explained hereinafter.

The device 1 includes a microcomputer 12 by which many means and measures are realized which, however, will not be further discussed here. By means of the microcomputer 12 are realized first control signal detection and digitizing means 13 and second control signal detection and digitizing means 14.

To the first control signal detection and digitizing means 13 can be applied analog control signals which can be generated via the keys of the key set 8 and the tracking ball 9. By means of the first control signal detection and digitizing means 13, the analog control signals applied thereto can be converted into digital control signals DCS, which digital control signals DCS are available on a first output 15 of the microcomputer 12.

To the second control signal detection and digitizing means 14 can be applied analog control signals which can be generated by the first key 10 and the second key 11. Digital control instructions CMD, which are available on a second output 16 of the microcomputer 12, can be generated by means of the second control signal detection and digitizing means 14 in dependence on the analog control signals applied thereto.

The device 1 further includes a multiplexer 17 to whose first input 18 can be applied the digital speech signals DVS produced by the speech signal digitizing means 6 and to whose second input 19 can be applied the digital control signals DCS produced by the first control signal detection and digitizing means 13. The multiplexer 17 provides a processing, that is, a multiplexing of the digital speech signals DVS and digital control signals DCS applied thereto. The multiplexer 17 thus forms digital signal processing means. The multiplexer 17 produces the digital speech signals DVS processed by it and the digital control signals DCS processed by it on an output 20.

The device 1 further includes transmitter means 21 for transmitting processed digital speech signals DVS and processed digital control signals DCS, while the processed digital speech signals DVS and the processed digital control signals DCS can be applied to an input 22 of the transmitter means 21. The transmitter means 21 are arranged for transmission in cordless fashion, that is, based on the so-called infrared technique, the digital signals DVS and DCS applied thereto. The transmitter means 21 are thus in the form of infrared transmitter means by which infrared signals 23 are transmitted to receiving means 24 of the base station 2, which are schematically indicated by an arrow in FIG. 1.

The base station 2 includes the receiving means 24 mentioned above which are in the form of infrared receiving means here. To the receiving means 24 is connected a demultiplexer 25 which demultiplexes the digital speech signals DVS and digital control signals DCS transmitted to the base station 2 in cordless fashion. The demultiplexer 25 produces the digital speech signals DVS transmitted to the base station 2 on a first output 26. The demultiplexer 25 produces the digital control signals DCS transmitted to the base station 2 on a second output 27.

To the first output 26 of the multiplexer 25 are connected speech signal processing means 28. The speech signal processing means 28 can process the digital speech signals DVS applied thereto, after which the processed speech signals are available on an output 29 of the speech signal processing means 28. From the output 29, the processed speech signals can be applied to further speech signal processing means of the base station 2 which, however, will not be further discussed here.

To the second output 27 of the multiplexer 25 are connected control signal processing means 30. The control signal processing means 30 can process the digital control signals DCS produced by the multiplexer 25 and available on its second output 27, after which processed control signals are available on an output 31 of the control signal processing means 30. From the output 31 of the control signal processing means 30 the processed control signals can be applied to a further control signal processing means of the base station which, however, will not be further discussed here either.

The device 1, thus the dictation microphone, advantageously has storage means 32 in the present case. The configuration of the device 1 and of the storage means 32 of the device 1 is such that the storage means 32 can be removed from the device 1. To ensure this, the device 1 has an insertion slot 33 into which the storage means 32 can be inserted. The storage means 32 may be formed, for example, by commercially available memory cards which contain a read-only memory.

The storage means 32 have various terminals or connecting contacts respectively, of which FIG. 1 shows only three terminals schematically indicated by arrow heads, that is to say, a user signal input terminal 34, a user signal output terminal 35 and a control terminal 36. The user signal input terminal 34 is connected to the output 20 of the multiplexer 17. The user signal output terminal 35 is connected to the input 22 of the transmitter means 21. The control terminal 36 is connected to the second output 16 of the microcomputer 12. Thus, in the device 1 the storage means 32 are connected downstream of the multiplexer 17 and upstream of the transmitter means 21. Furthermore, this provides that the digital speech signals DVS to be transmitted can be stored by the storage means 32 and the digital speech signals DVS to be transmitted can also be read out again from the storage means 32 and applied to the transmitter means 21. In the present case there is further provided that the storage means 32 are additionally arranged for storing and reading digital control signals DCS to be transmitted, because also the digital control signals DCS can be applied to the storage means 32 by the multiplexer 17.

The device 1 comprises control means 37 for the storage means 32 by which control means, in the case where digital speech signals DVS and digital control signals DCS cannot be perfectly well transmitted in cordless fashion from the transmitter means 21 of the device 1 to the receiving means 24 of the base station 2, can deactivate the reading of digital speech signals DVS and digital control signals DCS to be transmitted and can activate the reading of digital speech signals DVS and digital control signals DCS to be transmitted when there is a perfect transmission. In the present case the control means 37 are formed by the first key 10 and the second key 11 as well as the second control signal detection and digitizing means 14.

It should be observed that the electrically conducting connections to and from the storage means 32 are shown only schematically in the FIG. 1, in reality these connections are formed by a bus link or a bus system respectively.

With normal operation of the device 1 and of the base station 2 there is a perfect communication link between the transmitter means 21 of the device and the receiving means 24 of the base station 2, so that digital speech signals DVS and digital control signals DCS can be perfectly well transmitted in cordless fashion from the transmitter means 21 to the receiving means 24. In this case a user applies to the storage means 32, by reading a dictation aloud, speech signals DVS which have been input and digitized and, as the case may be, simultaneously digitized control signals DCS which are input after they have been multiplexed by the multiplexer 17 and buffered in the storage means 32 and practically immediately after that, thus simultaneously, again read out from the storage means 32 and applied to the transmitter means 21 and, therefore, transmitted to the receiving means 24 of the base station 2, so that, when a dictation is uttered, the speech signals generated by the uttering of the dictation are processed in the base station 2 in a more or less undelayed manner, that is, stored or recorded respectively on the hard drive (not shown) of the base station 2.

When a user of the device 1 and of the base station 2 intends to move so much away from the base station 2 that a perfect communication link between the device 1 and the base station 2 is no longer guaranteed, thus that digital speech signals DVS and digital control signals DCS are no longer perfectly transmitted from the transmitter means 21 to the receiving means 24 in cordless fashion, the user actuates the first key 10 of the control means 37, which leads to the fact that the second control signal detection and digitizing means 14 produce a first digital control instruction CMD on the second output 16 of the microcomputer 12 and, therefore, on the control terminal 36 of the storage means 32, which in its turn leads to the fact that the reading of digital speech signals DVS and digital control signals DCS from the storage means 32 is terminated. This means that during the further dictation the digital speech signals DVS generated during this operation are further applied to the storage means 32 through the user signal input terminal 34 and, therefore, are stored in the storage means 32, but that there is no simultaneous reading of the digital speech signals DVS. During the interrupted communication link between the device 1 and the base station 2, or between the transmitter means 21 and the receiving means 24, a bridging period is created so that despite the continued dictation no digital speech signals generated during this operation are lost.

When later on the user again returns to the base station 2 with the device 1 held in hand, thus when there is again a perfect communication link between the device 1 and the base station 2 and, consequently, between the transmitter means 21 and the receiving means 24 and thus digital speech signals DVS and digital control signals DCS can perfectly well be transmitted in cordless fashion from the transmitter means 21 to the receiving means 24, the user actuates the second key 11 of the device 1, which leads to the fact that the second control signal detection and digitizing means 14 generate a second digital control instruction CMS and apply this signal via the second output 16 of the microcomputer 12 to the control terminal 36 of the storage means 32. This leads to the fact that a start is made with reading the memory, thus that the digital speech signals DVS buffered in the storage means 32 during the bridging period and, as the case may be, also buffered digital control signals DCS, are from now on again read from the storage means 32 and applied to the transmitter means 21, so that these digital signals DVS and DCS are transmitted to the receiving means 24 and are subsequently processed in the base station 2.

Figure 2:
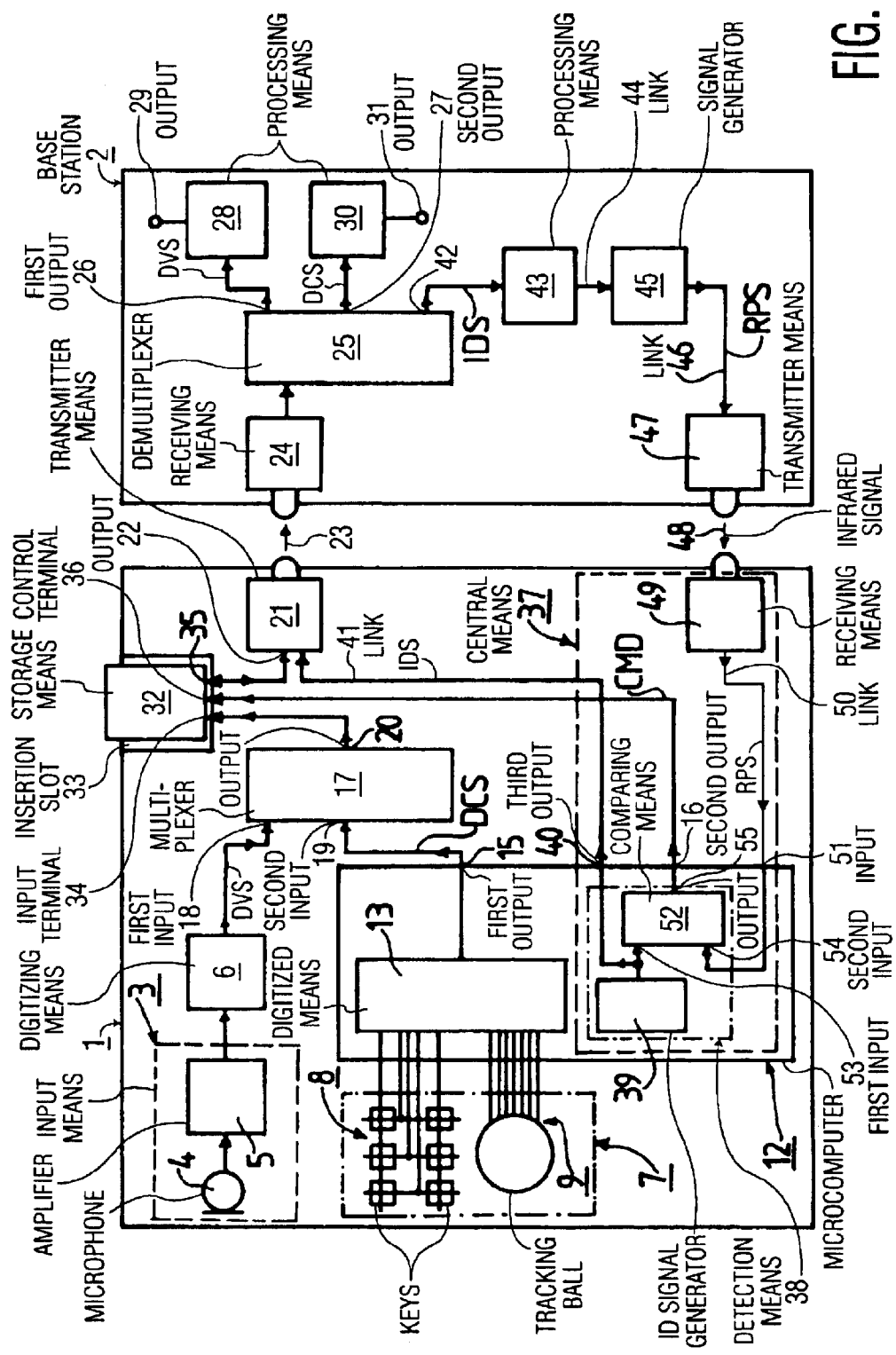
FIG. 2 shows in similar manner to that of FIG. 1 a device according to the invention corresponding to a second example of embodiment of the invention.

FIG. 2 shows a device 1 in accordance with a second example of embodiment of the invention where this is also a so-called dictation microphone and which also cooperates with the base station 2 in the form of a personal computer. The device 1 and the base station 2 as shown in FIG. 2 partly have the same configuration as the device 1 and the base station 2 shown in FIG. 1, as a result of which only the different features will be further discussed hereinafter.

In the device 1 shown in FIG. 2 the control means 37 include detection means 38 which are realized by the microcomputer 12. The detection means 38 provide that digital speech signals DVS and, in the present case, also digital control signals DCS, can be perfectly well transmitted in cordless fashion from the transmitter means 21 of the device 1 to the receiving means 24 of the base station 2. In dependence on the detection result established by the detection means 38, they can generate a control instruction CMD and can consequently deactivate or activate the reading from the storage means 32 of stored digital speech signals DVS and of digital speech signals DVS to be transmitted and stored digital control signals DCS and digital control signals DCS to be transmitted.

The detection means 38 include an identification signal generator 39 for generating an identification signal IDS. In the present case the identification signal generator 39 has generated a specific identification signal for a specific base station, that is, for the base station 2. The identification signal IDS is in the present case a digital identification signal comprising a predefined zero-one combination, which zero-one combination is specific of, thus significant or characteristic of the base station 2. The identification signal IDS is available on a third output 40 of the microcomputer 12 and can be transmitted to the transmitter means 21 via a link 41 and, consequently, be transmitted by the transmitter means 21 to the receiving means 24 of the base station 2.

After the identification signal IDS has been transmitted to the base station 2, the identification signal IDS is applied to the demultiplexer 25 from the receiving means 24, after which the demultiplexer 25 produces the digital identification signal IDS on a further output 42. To the further output 42 of the demultiplexer 25 are connected identification signal processing means 43, which provide the processing of the received identification signal IDS. Within the scope of this processing, the digital identification signal IDS, thus the received zero-one combination, is tested to find out whether this is a significant or specific zero-one combination for the base station 2. If this is the case, the identification signal processing means 43 drive a response signal generator 45 of the base station 2 via a link 44, after which in the present case the response signal generator 45 generates a digital response signal RPS, which comprises the same zero-one combination as the digital identification signal IDS. The digital response signal RPS is applied to the transmitter means 47 of the base station 2 via a link 46. The transmitter means 47 are also infrared transmitter means, which transmit infrared signals 48 which are schematically indicated by an arrow in FIG. 2 to the device 1.

The device 1, that is, the control means 37 of the device 1, comprise receiving means 49 which are also infrared receiving means. The infrared signals 48 transmitted by the transmitter means 47 can be received by the receiving means 49, so that in this way the digital response signal RPS generated in the base station 2 can be received by the receiving means 49. The received digital response signal RPS can be applied from the receiving means 49 via a link 50 to an input 51 of the microcomputer 12.

By means of the microcomputer 12 are realized comparing means 52 which form part of the detection means 48. The comparing means 52 have a first input 53 and a second input 54 and an output 55. The first input 53 is connected to the identification signal generator 39, so that the digital identification signal IDS can be applied to the first input 53. The second input 54 is connected to the input 51 of the microcomputer 12, so that the digital response signal RPS can be applied to the second input 54. The comparing means 52 are provided for comparing the transmitted digital identification signal IDS to the received digital response signal RPS, which digital response signal RPS—as already explained above—can be generated by the response signal generator 45 of the base station 2 as a consequence of transmitted digital identification signals IDS and be transmitted to the device 1.

In the case where there is a positive comparison result, thus when the transmitted digital identification signal IDS and the received digital response signal RPS have the same zero-one combination, thus when there is a perfect communication link between the device 1 and the base station 2, the comparing means 52 produce on their output 55 a control instruction CMD which is applied to the control terminal 36 of the storage means 32 via the further output 16 of the microcomputer 12, which leads to the fact that the digital signals DVS and DCS stored in the storage means 32 are read out undelayed and applied to the transmitter means 21 and, consequently, to the base station 2.

If, in contrast, a negative comparison result occurs in the comparing means 52, which is the case when the digital response signal RPS is no longer transmitted in perfect condition or no longer transmitted at all from the base station to the device 1, thus when there is no longer a perfect communication link between the device 1 and the base station 2, the comparing means 52 produce on their output 55 a control instruction CMD which provides that the reading of digital signals from the storage means 32 is terminated, so that from this instant on digital signals are buffered in the storage means 32 for a bridging period.

When, subsequently, the perfect communication link between the device 1 and the base station 2 is re-established, this leads to the fact that again a positive comparison result is obtained with the comparing means 52, which is announced to the control terminal 36 of the storage means 32 via a control instruction CMD through the output 55, which leads to the fact that the reading of the storage means is started again, so that the digital signals DVS and DCS buffered during the bridging period are continued to be transmitted to the base station 2 and processed there.

The invention is not restricted to the two examples of embodiment described hereinbefore. The storage means may also be ready-made in a device according to the invention. Also differently arranged control means can be provided for the storage means. Furthermore, it should be observed that, after a bridging period has ended, digital signals can also be read out from the storage means at a higher reading rate than is the case during simultaneous reading in normal operation. Transmitting digital signals in cordless fashion between a device according to the invention and a base station may also be effected in a different way from the so-called infrared technique, for example, based on the so-called radio frequency technique. In a modified and simplified arrangement of a device according to the invention described with reference to FIG. 2, in lieu of separate infrared transmitter means or RF transmitter means and infrared receiving means or RF receiving means, also combined IR transmitter/receiving means or RF transmitter/receiving means can be provided, which also holds for the base station.

What is claimed is:

1. A hand held device for processing speech signals, the device comprising:
   a speech signal input means for inputting speech signals;
   a speech signal digitizing means for digitizing the speech signals;
   a control signal input means for inputting control signals;
   a control signal digitizing means for digitizing the control signals;
   a digital signal processing means for processing the digital speech signals and digital control signals;
   a transmitter means for transmitting the processed digital speech signals and processed digital control signals in cordless manner to a base station;
   a storage means which is connected upstream of the transmitter means and by which storage means can be stored the digital speech signals to be transmitted and from which storage means can be read out the digital speech signals to be transmitted; and
   a control means which can activate and deactivate the reading of digital speech signals from the storage means depending on transmission quality between the device and the base station.

2. The device as claimed in claim 1, wherein the storage means is additionally provided for storing and reading digital control signals to be transmitted.

3. The device as claimed in claim 1, wherein the detection means is provided to determine the transmission quality between the device and the base station.

4. The device as claimed in claim 3, wherein the detection means includes an identification signal generator for generating an identification signal and in that the identification signal can be applied to the transmitter means and transmitted by the transmitter means to the base station.

5. The device as claimed in claim 4, wherein the detection means includes a comparing means for comparing the transmitted identification signal with a response signal of a base station and transmitted to the device as a sequence of the transmitted identification signal.

6. The device as claimed in claim 4, wherein the detection means includes an identification signal generator for generating an identification signal specific to a particular base station.

7. The device as claimed in claim 1, wherein the device and the storage means are arranged so that the storage means can be removed from the device.

* * * * *